(12) United States Patent
Govind et al.

(10) Patent No.: US 7,081,672 B1
(45) Date of Patent: Jul. 25, 2006

(54) SUBSTRATE VIA LAYOUT TO IMPROVE BIAS HUMIDITY TESTING RELIABILITY

(75) Inventors: Anand Govind, Fremont, CA (US); Aritharan Thurairajaratnam, San Jose, CA (US); Farshad Ghahghahi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/073,802

(22) Filed: Mar. 7, 2005

(51) Int. Cl.
  *H01L 23/34* (2006.01)
(52) U.S. Cl. ............ 257/724; 174/262; 174/263; 174/264; 174/265; 174/266; 361/780; 361/767; 361/768
(58) Field of Classification Search ........ 174/260–266, 174/36; 361/767, 768, 780
See application file for complete search history.

(56) References Cited

U.S. PATENT DOCUMENTS

| | | | | |
|---|---|---|---|---|
| 4,829,404 A | * | 5/1989 | Jensen | ............... 361/749 |
| 5,219,639 A | * | 6/1993 | Sugawara et al. | ............ 428/209 |
| 6,037,044 A | * | 3/2000 | Giri et al. | ............... 428/209 |
| 6,191,479 B1 | * | 2/2001 | Herrell et al. | ............ 257/724 |
| 6,590,479 B1 | * | 7/2003 | Yoshida et al. | ............ 333/260 |
| 6,762,366 B1 | | 7/2004 | Miller et al. | ............... 174/250 |
| 6,768,206 B1 | | 7/2004 | Hosomi | ................ 257/774 |
| 6,833,513 B1 | * | 12/2004 | Ahmad | ............... 174/262 |
| 2002/0159243 A1 | * | 10/2002 | Ogawa et al. | ............ 361/760 |
| 2003/0043560 A1 | * | 3/2003 | Clarkson et al. | ............ 361/782 |
| 2004/0003941 A1 | * | 1/2004 | Duxbury et al. | ............ 174/261 |
| 2004/0194999 A1 | * | 10/2004 | Tomita et al. | ............ 174/250 |
| 2005/0161254 A1 | * | 7/2005 | Clink et al. | ............... 174/262 |

* cited by examiner

*Primary Examiner*—Randy W. Gibson
*Assistant Examiner*—Hoa C. Nguyen
(74) *Attorney, Agent, or Firm*—Westman, Champlin & Kelly

(57) ABSTRACT

A substrate is provided, which has a pattern of voltage supply vias extending through at least a portion of the substrate. Each of a plurality of the voltage supply vias is surrounded by four of the voltage supply vias of a same polarity in four orthogonal directions and by four voltage supply vias of an opposite polarity in four diagonal directions.

19 Claims, 4 Drawing Sheets

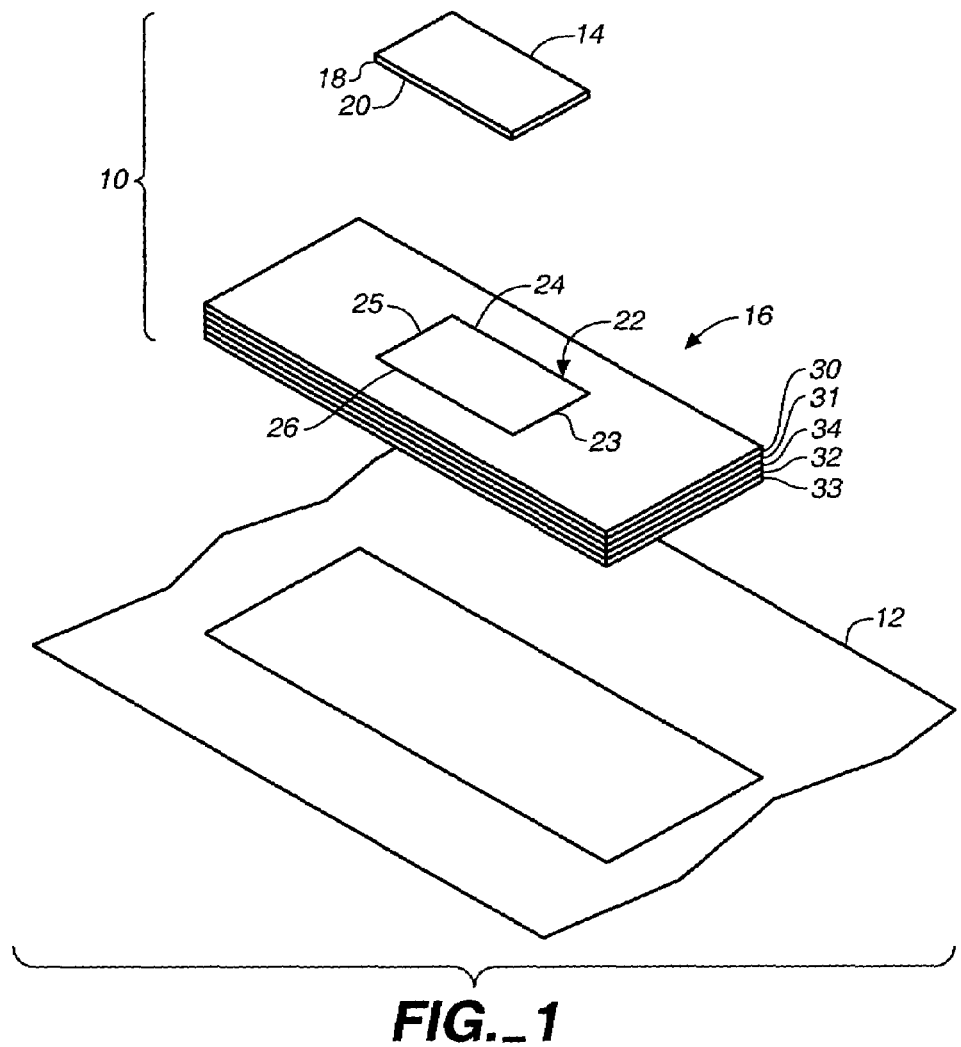
FIG._1
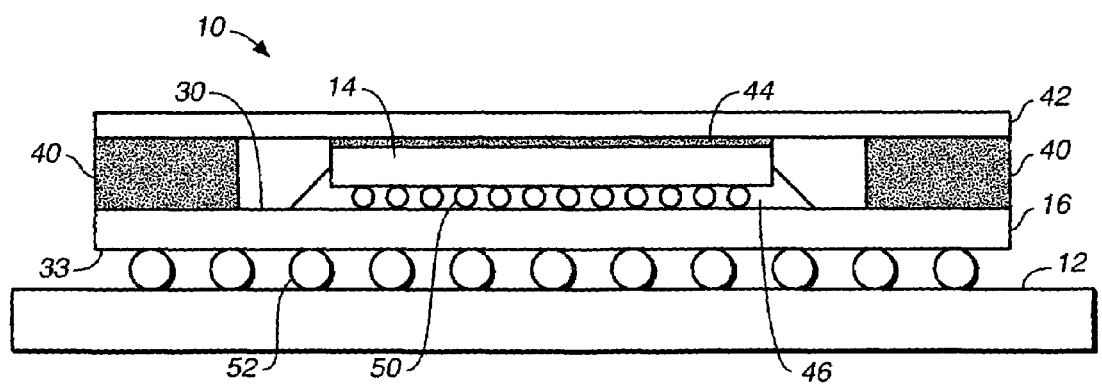
FIG._2

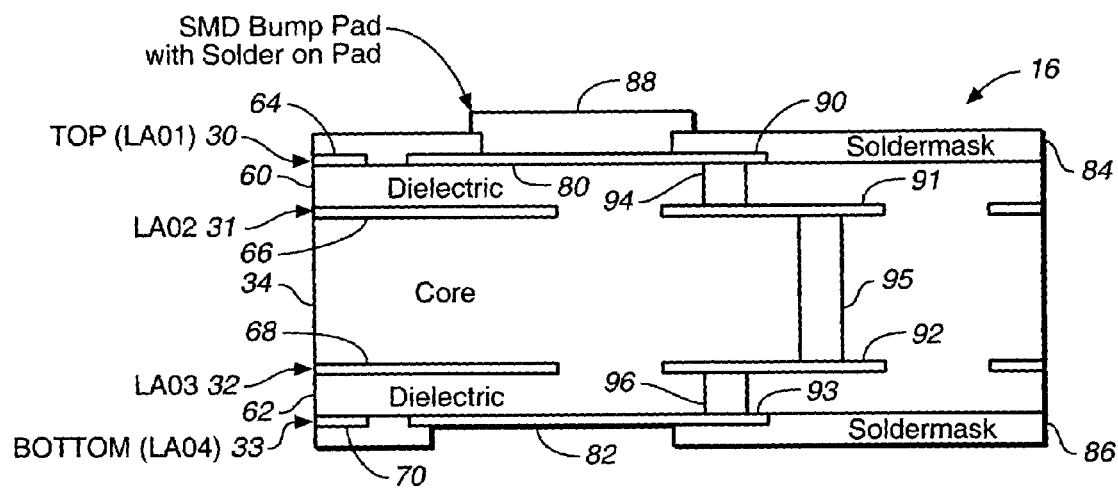
FIG._3
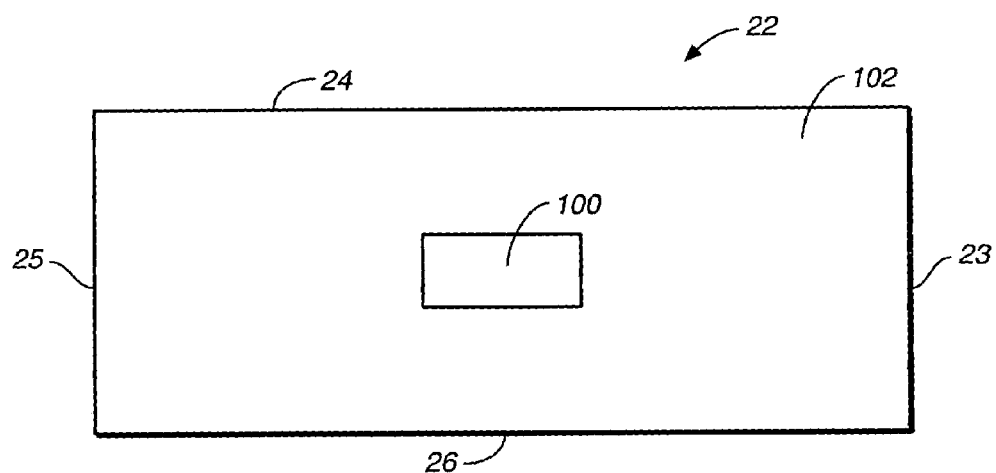
FIG._4

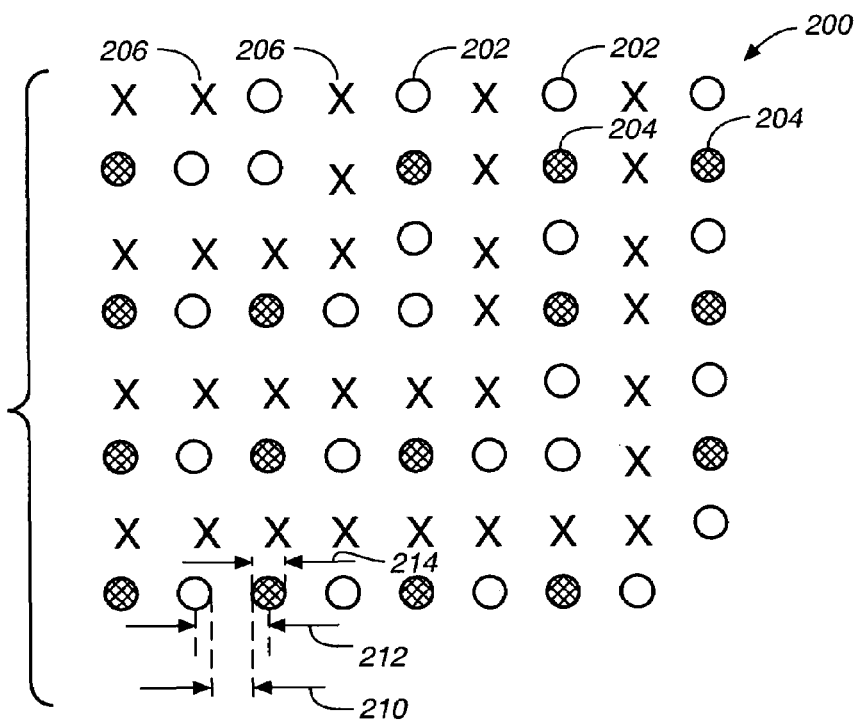
FIG._5
(PRIOR ART)
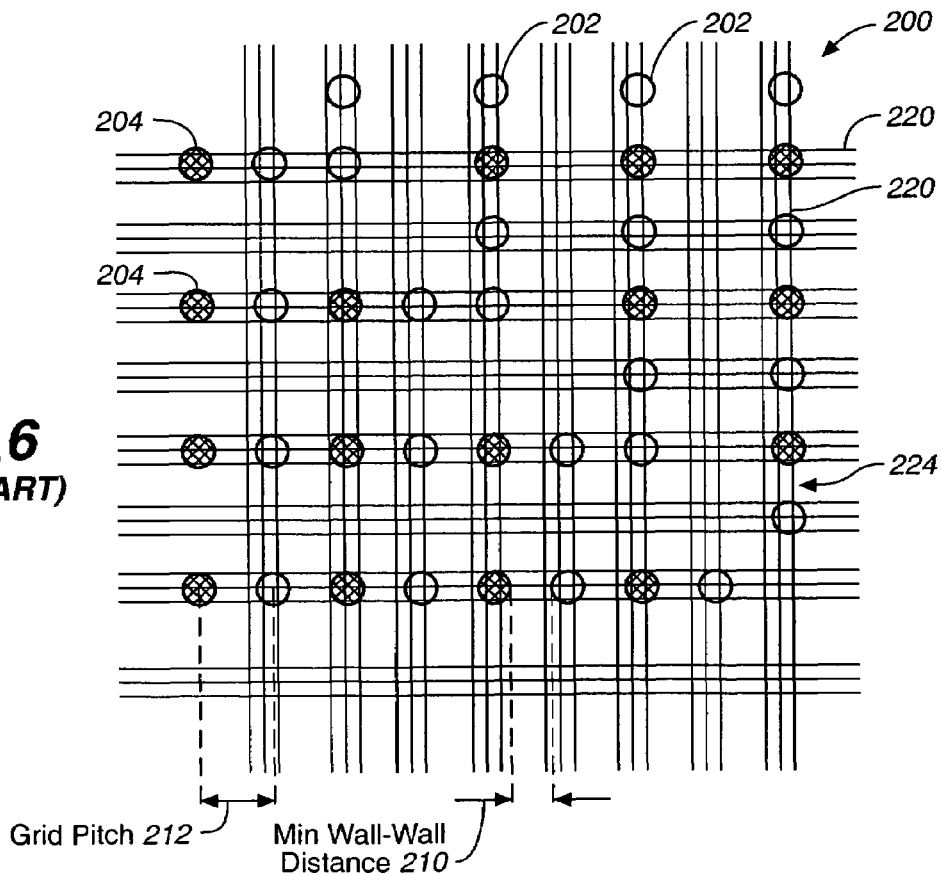
FIG._6
(PRIOR ART)

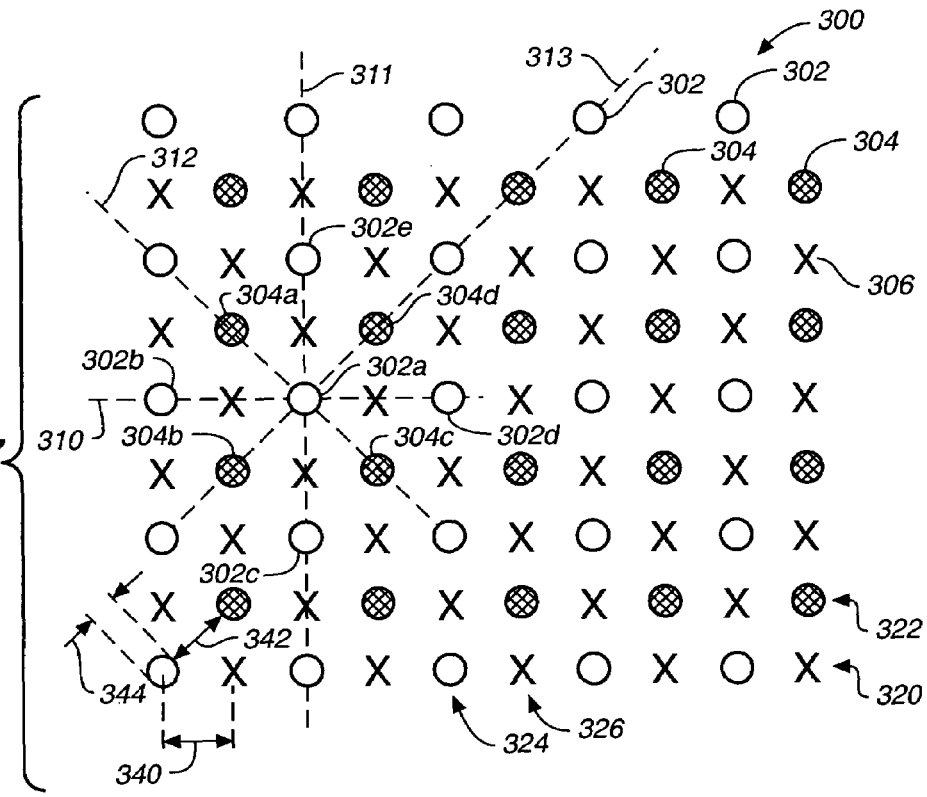
FIG._7
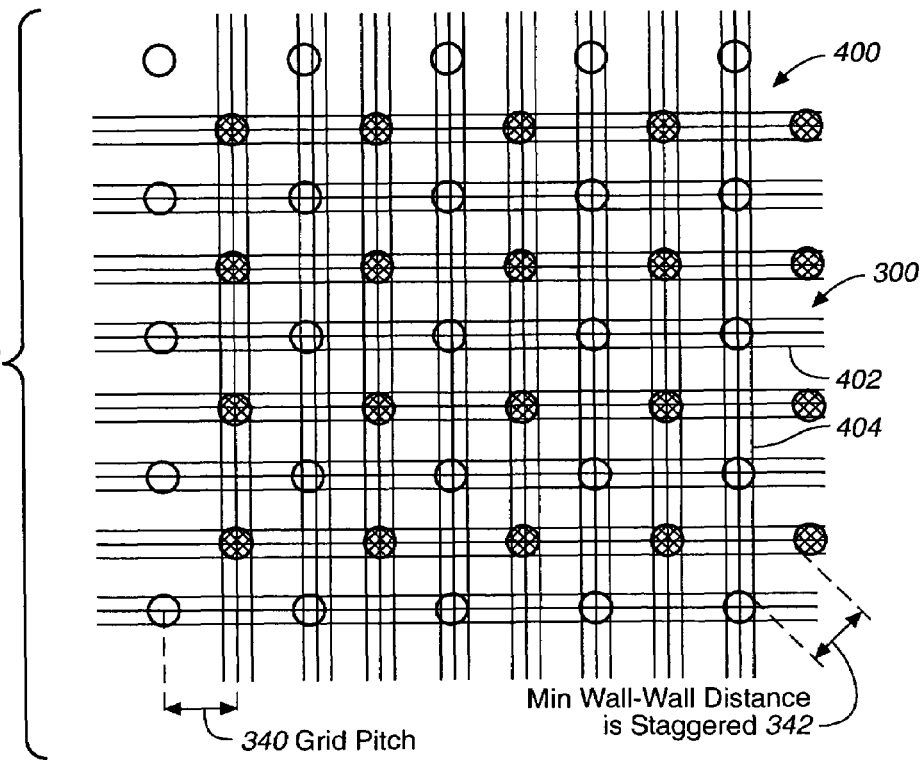
FIG._8

SUBSTRATE VIA LAYOUT TO IMPROVE BIAS HUMIDITY TESTING RELIABILITY

CROSS-REFERENCE TO RELATED APPLICATION

None.

FIELD OF THE INVENTION

The present disclosure relates to integrated circuits. More particularly, the present disclosure relates to the layout of voltage supply vias through substrates in applications such as flip chip packaging, wire bond packaging, printed circuit boards and the like for consumer, communication, and networking markets, for example.

BACKGROUND OF THE INVENTION

A "flip chip" package, "wire bond" package and multi-stacked die technology refer to integrated circuits that include at least one semiconductor die, which is bonded to a substrate. In a flip chip package, a semiconductor is bonded circuit-side down to the substrate, with direct electrical interconnection between the die and the substrate. In a wire bond package, the semiconductor die is bonded to the substrate with electrical leads from the die connecting to the substrate around the periphery of the die.

The substrate can be a passive carrier such as a printed circuit board, or it can be another semiconductor chip. The substrate is normally bonded directly to a motherboard. Other flip chips and other integrated circuits employing a variety of more traditional packages, such as lead frame packages, surface mounts, pin grid arrays and the like can also be mounted to the motherboard.

One purpose that the substrate serves is to allow the input-output (I/O) signals on the die to "escape" the die onto the motherboard and to provide electrical power to the die from the motherboard. Die are usually quite small, and contain as many as hundreds of I/O signals as well as numerous power and ground connections. There can be "bumps" (e.g., solder spheres) on the surface pads of the die to facilitate electrical connections to the substrate. Since these bumps are densely packed together onto the small die, it may not be practical to attempt to bond such tightly packed bumps to a motherboard. The substrate serves the purpose of spreading-out these densely packed bumps to a much less dense spacing, so that the I/O signals and power and ground connections can then be connected to the motherboard.

When a flip chip die is mounted to a substrate, the bumps on the die are the points of physical and electrical contact between the die and the substrate. The bumps carry electrical signals including power and ground to and from the die. The substrate has a surface, typically the surface opposite the side on which the die is mounted, which has a plurality of contacts called pads or lands. A solder ball is typically attached to each land for soldering to the motherboard. The solder balls are collectively referred to as a ball grid array, because they are usually arranged in a grid pattern. A "ball assignment scheme" is a pattern in which the balls for the I/O signals and power and ground connections are assigned on the substrate.

Each I/O bump in the die bonding area is directly connected to a corresponding ball in the ball grid array on the other surface of the substrate through conductive segments called "traces" along one or more layers in the substrate and through one or more "vias" between the layers.

Recent silicon technology advances demand higher performance package designs. For example as the core voltage level reduces with each successive generation of silicon, there is a desire to further reduce noise in the core voltage plane. It is therefore desirable for the substrate design to have a large number of core voltage supply vias (e.g., VSSCORE and VDDCORE) that are electrically coupled in order to reduce core plane impedance so that core noise is minimized. On a semiconductor die, the devices that are biased at the low core voltage levels are typically located in a central area of the die. Therefore, vias in the substrate that supply the core voltage to the die are typically arranged on the substrate in a grid pattern under the center of the die. Maximizing the density of the core voltage supply vias under the center of die therefore requires the vias to be added at a minimum possible pitch.

A typical via layout attempts to maximize the number of core voltage supply vias to provide good electrical coupling between the vias leading to a low impedance connection. However, the wall-to-wall distance between power and ground vias can therefore be small. When a via is "drilled" through a material that has woven glass fiber reinforcements running in a typical orthogonal pattern, there is a possibility for glass fibers to line up from one via wall to the next. Under typical field operating conditions, in the presence of humidity and a voltage bias between the core power and ground vias, copper migration can occur from the via wall of the anode (a core power via) to the via wall of the cathode (a core ground via). Copper migration can cause a conductive path to develop leading to failure in the field or during reliability testing, which is a time and temperature dependent variable.

One existing solution is to reduce the number of core voltage supply vias to increase the spacing between core power vias and core ground vias. However, this solution increases core impedance due to the lower number of vias.

Another difficulty encountered with via layouts is that the grid via pattern and the core power and ground via assignments can lead to lower manufacturing yield for the supplier due to a need to electrically isolate the densely packed core power and ground vias.

Improved via layout patterns for substrates are therefore desired.

SUMMARY OF THE INVENTION

One embodiment of the present invention is directed to a substrate, which has a pattern of voltage supply vias extending through at least a portion of the substrate. Each of a plurality of the voltage supply vias is surrounded by four of the voltage supply vias of a same polarity in four orthogonal directions and by four voltage supply vias of an opposite polarity in four diagonal directions.

Another embodiment of the present invention is directed to a substrate having a pattern of voltage supply vias extending through at least a portion of the substrate. The pattern has rows of the voltage supply vias having a first polarity, which are interleaved with rows of the voltage supply vias having a second, opposite polarity. The pattern has columns of the voltage supply vias having the first polarity, which are interleaved with columns of the voltage supply vias having a second, opposite polarity.

Another embodiment of the present invention is directed to a substrate having a first arrangement of electrical contacts on a first surface of the substrate and a second arrangement of electrical contacts on a second, opposite surface of the substrate. The first arrangement includes a set of first type and second type voltage supply contacts. The second arrangement also includes a set of first type and second type voltage supply contacts. A plurality of voltage supply vias extend through at least one layer of the substrate. Each via is electrically coupled between at least one of the voltage supply contacts on the first surface and at least a one of the voltage supply contacts on the second surface. It should be noted that it is not necessary to have a one-to-one connection between the pads on the die side and those on the ball side. Multiple die pads could be bussed together through internal planes to one ball pad and vice-versa. The voltage supply contacts form a pattern in which each of the voltage supply vias is surrounded by four of the voltage supply vias of the same type in four orthogonal directions and by four voltage supply vias of the opposite type in four diagonal directions.

BRIEF DESCRIPTION OF THE DRAWINGS

FIG. 1 is an exploded, perspective view of a flip chip, which can be mounted to a motherboard according to one embodiment of the present disclosure.

FIG. 2 is a cross-sectional view of the flip chip mounted to the motherboard.

FIG. 3 is a fragmentary, cross-sectional view of a four-layer substrate according to one embodiment of the present invention.

FIG. 4 is a plan view of die bonding area on the substrate according to one embodiment of the present invention.

FIG. 5 is a diagram illustrating a grid via pattern for arranging core voltage supply vias within the die bonding area shown in FIG. 4 according to one example of the prior art.

FIG. 6 is a diagram illustrating the via layout pattern shown in FIG. 5 relative to an orthogonal pattern of a glass fiber weave.

FIG. 7 is a diagram illustrating a grid via pattern for arranging core voltage supply vias within the die bonding area according to one embodiment of the present invention.

FIG. 8 is a diagram illustrating the via layout pattern shown in FIG. 7 relative to an orthogonal pattern of a reinforcing glass fiber weave.

DETAILED DESCRIPTION OF ILLUSTRATIVE EMBODIMENTS

This disclosure relates to a core voltage via grid pattern for substrates used in various packaging technologies in integrated circuits, such as flip chip packages, wire bond packages, printed circuit board applications and the like.

The disclosure, including the figures, describes substrates in the context of ball grid arrays and ball assignment schemes among others, with reference to several illustrative examples. Other examples are contemplated and are mentioned below or are otherwise imaginable to someone skilled in the art. The scope of the invention is not limited to the few examples, i.e., the described embodiments of the invention. Rather, the scope of the invention is defined by reference to the appended claims. Changes can be made to the examples, including alternative designs not disclosed and to other packaging or substrate applications, and still be within the scope of the claims.

FIG. 1 is an exploded, perspective view of a flip chip 10, which can be mounted to a motherboard 12 according to one embodiment of the present disclosure. A flip chip provides a suitable environment for the core voltage via layout patterns of the present disclosure. Other packaging technologies, such as wire bond, in either a single chip or multi-stacked die, printed circuit boards or others can also provide suitable environments for the present disclosure.

Flip chip 10 includes an integrated circuit die 14 and a substrate 16. Die 14 includes an integrated circuit 18 formed on a face side 20 of die 14. Die 14 is mounted face side down to substrate 16 and electrically connected and bonded to substrate 16 within die bonding area 22. Electrical connections are typically performed by soldering, for example. Die bonding area 22 includes edges 23, 24, 25 and 26, which define a perimeter of the die bonding area.

Substrate 16 typically includes a plurality of conductive layers. In one embodiment, substrate 16 includes a total of four conductive layers, including a top layer 30, a second layer 31, a third layer 32 and a bottom layer 33, which are fabricated on a core 34 and are electrically isolated from one another by dielectric layers. However, substrate 16 can have any number of layers, such as 1, 6, 8, 10 etc. The dielectric layers are formed of an insulating dielectric material such as polyamide, epoxy based, PCB laminate, Polytetrafluoroethylene (PTFE), FR4, BT resin, ceramic or any other insulator used for semiconductor packages. Also, other types of substrates can be used, such as "decals" or printed double-sided flex tape with or without stiffeners. The bottom layer 33 of substrate 16 is mounted to motherboard 12. The conductive layers on substrate 16 carry "traces" of conductive segments, including vias, for interconnecting signals and supply voltages between die 14 and motherboard 12.

FIG. 2 is a cross-sectional view of flip chip 10 mounted to motherboard 12. Flip chip 10 has a package formed by substrate 16, stiffener 40 and heat spreader 42, and underfill 46. Heat spreader 42 is attached to die 14 with an adhesive 44.

The face side 20 of die 14 includes a plurality of "bumps" 50 (such as solder spheres in the example) to facilitate electrical connections from the face side 20 of the die 14 to the top conductive layer 30 of substrate 16. These bumps are densely packed together onto the small die. It may not be practical to attempt to bond such tightly packed bumps to motherboard 12. Therefore, substrate 16 serves the purpose of spreading-out these densely packed bumps to a much less dense spacing so that the I/O signals along and power and ground contacts can be connected to motherboard 12.

A plurality of solder balls 52, as illustrated in the example, are attached to the bottom conductive layer 33 of substrate 16 to facilitate the electrical interconnections between substrate 16 and motherboard 12. In one embodiment, solder balls 52 are arranged in a ball grid array on bottom layer 33. Solder balls 52 are much less densely packed than bumps 50. Each bump 50 is electrically connected to a corresponding one of the solder balls 52 through conductive segments in one or more of the layers in substrate 16 and through one or more electrical vias between the layers.

FIG. 3 is a fragmentary, cross-sectional view of a four-layer substrate 16 according to one embodiment of the present invention. As described above, substrate 16 includes four conductive layers including top layer 30, a second layer 31, a third layer 32 and a bottom layer 33, which are fabricated on core 34 and are electrically isolated from one another by dielectric layers 60 and 62. Each conductive layer includes one or more conductive segments, such as segments 64, 66, 68 and 70.

In this example, bump pad 80 on top layer 30 and ball grid array pad 82 on bottom layer 33 are solder mask defined (SMD) pads, which are defined by solder masks 84 and 86, respectively. However, non-solder mask defined pads can be used in alternative embodiments of the present invention. A solder bump 88 is formed on pad 80 for electrically connecting to a corresponding contact on the face side 20 of die 14 (shown in FIGS. 1 and 2).

Pad 80 is electrically connected to pad 82 through conductive segments 90, 91, 92 and 93 and conductive vias 94, 95 and 96. Vias 94, 95 and 96 can be fabricated with any technique or technology, such as by mechanical drilling, laser drilling or sequential built-up or removal of material.

In the embodiment shown in FIG. 3, vias 94 and 96 are blind vias. A blind via hole connects an external layer of substrate 16 to one or more of the internal layers by through hole plating, for example. This hole may be filled with resin, plated over or left open depending on the design. Alternatively, a blind via hole may be filled completely with conductive material. This disclosure also applies to the through hole technology which does not have blind or buried vias.

Via 95 is a buried via. A buried via hole is two or more internal layers having an electrical connection made between them by through hole plating, for example. Again, this hole maybe filled with resin during a lamination cycle or maybe filled completely with conductive material. In any case, vias 94, 95 and 96 electrically connect conductive segments 90, 91, 92 and 93, such that pad 80 on top layer 30 is electrically connected to its corresponding pad 82 on bottom layer 33. In this manner, each pad on top layer 30 can be electrically connected to at least one corresponding pad on bottom layer 33.

A typical integrated circuit die is powered at one or more voltage supply levels. Typically, the semiconductor devices within the internal core area of the die are powered at a relatively low core voltage supply level while input-output (I/O) circuitry can be powered at higher voltage levels. The core voltage supply areas in a die are typically located in the center regions of the die. It is therefore desirable for substrate 16 to have a large number of core voltage supply vias under the center of the die to reduce core plane inductance so that noise in the die core is minimized. However, maximizing the density of the core voltage supply vias under the center of the die suggests that the vias should be added at a minimal possible pitch. Although such a pattern can reduce core plane impedance, the pattern can also cause reliability problems as described in more detail below.

FIG. 4 is a plan view of die bonding area 22 (shown in FIG. 1) on substrate 16. The bump pads and vias for routing the core power and ground voltages through substrate 16 are typically arranged in a central area 100 within the die bonding area 22. Individual pads and vias are not shown in FIG. 4. The bump pads and vias for routing signal wires and other voltage supply levels through substrate 16 are typically arranged in peripheral area 102 of the die bonding area. In one embodiment, central area 100 is void of any signal pads or vias.

FIG. 5 is a diagram illustrating grid via pattern 200 for arranging the core voltage supply vias (e.g., VSSCORE and VDDCORE) within area 100 (shown in FIG. 4.) according to one example of the prior art. In FIG. 5, the hollow circles represent buried VSSCORE vias, such as via 202. Crosshatch circles represent buried VDDCORE vias, such as via 204. Each "X" represents a blind via, such as blind via 206.

With this via layout, the number of core voltage supply vias is maximized in pattern 200, and good coupling is achieved along the vias leading to a low impedance power supply connection. However, the wall-to-wall distance 210 between adjacent power and ground vias is rather small. The wall-to-wall distance 210 between oppositely biased vias is equal to the grid pitch 212 minus the via hole diameter 214.

When vias 202 and 204 are drilled through a material that has woven glass fiber reinforcements running in a typical orthogonal pattern, there is a possibility for glass fibers to line up from one via wall to the next.

FIG. 6 is a diagram illustrating via layout pattern 200 relative to an orthogonal pattern of a glass fiber weave 220. As shown by arrows 222 and 224, glass fibers line up from one via wall to the next. When a bias is applied between the VSSCORE vias 202 and the VDDCORE vias 204, copper migration can occur from the wall of the anode (VDDCORE via 204) to the cathode (VSSCORE via 202). Copper migration can cause a conductive path to develop between oppositely biased vias, which can lead to failure in the field or during reliability testing. This core voltage supply via layout can also lead to lower manufacturing yields for the supplier due to the need to isolate the VSSCORE and VDDCORE vias. The typical solution is to reduce the number of vias to increase spacing between the VSSCORE and VDDCORE vias. However, this leads to increased core inductance due to the lower number of vias.

FIG. 7 is a diagram illustrating a grid via pattern for arranging core voltage supply vias (e.g., VSSCORE and VDDCORE vias) within area 100 (shown in FIG. 4) according to one embodiment of the present invention. Grid via pattern 300 includes a plurality of buried ground vias 302, buried power vias 304 and blind vias 306. Again, the hollow circles represent buried ground (VSSCORE) vias, the crosshatch circles represent buried power (VDDCORE) vias, and each "X" represents a blind via 306.

With the pattern shown in FIG. 7, each of the core voltage supply vias 302 and 304 is surrounded by four of the voltage supply vias of the same polarity in four orthogonal directions and by four of the voltage supply vias of an opposite polarity in four diagonal directions. For example, VSSCORE via 302a is surrounded by four VSSCORE vias 302b–302e in the four orthogonal directions represented by dashed lines 310 and 311 and by four VDDCORE vias 304a–304d in the four diagonal directions represented by dashed lines 312 and 313.

The VSSCORE vias 302 having a first plurality are arranged in rows 320 which are interleaved with rows 322 of the VDDCORE vias having a second, opposite polarity. Also, The VSSCORE vias 302 are arranged in columns 324, which are interleaved with columns 326 of the VDDCORE vias 304 having the second, opposite polarity.

Grid pattern 300 further includes a respective blind via 306 for each buried via 302 and 304, which is electrically connected to the respective buried via. Each buried via 302 and 304 in the grid is separated from a nearest other buried via 302 or 304 in the four orthogonal directions by at least one of the blind vias 306. In this embodiment, grid pattern 300 is located on an area of the substrate, which comprises only voltage supply vias and is void of any signal vias.

With the arrangement shown in FIG. 7, the VSSCORE vias 302 and VDDCORE vias 304 are placed on a staggered grid and assigned so that no two vias of opposite bias lie along the same orthogonal straight line. This ensures that no glass fibers will connect from a VSSCORE via wall to a VDDCORE via wall. The minimum via wall-to-wall distance 342 between vias of opposite plurality is measured along a diagonal (such as diagonals 312 and 313). Grid pattern 300 has a grid pitch 340 and a via hole diameter 344. The minimum via wall-to-wall distance 342 is equal to the square root of two times the grid pitch 340 minus the via hole diameter 344 (i.e, sqrt(2)*(grid pitch)—via hole diameter). Via coupling is maximized since each via is surround by four vias of opposite polarity in four diagonal directions.

As compared to the grid pattern shown in FIG. 5, there is no change in via density, but via coupling is maximized. In this embodiment, the grid via pattern maximizes voltage supply coupling through the vias with no change in the total via count, while increasing the spacing between the walls of oppositely bias vias. As compared to the grid pattern shown in FIG. 5, the wall-to-wall spacing of oppositely biased vias is increased by 41%.

FIG. 8 is a diagram illustrating via layout pattern 300 relative to an orthogonal pattern of a reinforcing glass fiber weave 400. As shown by lead lines 402 and 404, glass fibers line up from one via wall to the next. However, copper migration is limited since no two vias of opposite bias lay along the same straight orthogonal line. This ensures that no glass fiber will connect from a VSSCORE via wall to a VDDCORE via wall. As a result, substrate has a higher robustness in bias humidity reliability tests, while the core inductance is maintained relatively low due to the large number of voltage supply vias in the core region.

As mentioned above, embodiments of the present invention can be implemented in other single or multi-layer substrates, including four-layer, six-layer, ten-layer, etc., substrates. This can also be applied in wirebond packages as well as PCBs.

It should be understood that vias or contacts having "opposite polarity" as that phrase is used in the specification and claims refers to vias or contacts to be biased at different voltage potentials, whether these voltage potentials are both positive, both negative, or one positive and one negative. For example, a "power" via would have "opposite polarity" to a "ground" via.

Although the present invention has been described with reference to preferred embodiments, workers skilled in the art will recognize that changes may be made in form and detail without departing from the spirit and scope of the invention.

What is claimed is:

1. A substrate comprising:
   a layer of woven fiber reinforcement having fibers woven in an orthogonal pattern; and
   a pattern of voltage supply vias extending through the layer of fiber reinforcement, wherein each of a plurality of the voltage supply vias has a side wall and is surrounded by four of the voltage supply vias of a same polarity in four orthogonal directions, which are generally aligned with the orthogonal pattern of the woven fiber reinforcement, and by four of the voltage supply vias of an opposite polarity in four diagonal directions, such that individual fibers of the woven fiber reinforcement connect the side walls of adjacent ones of the voltage supply vias having the same polarity only.

2. The substrate of claim 1 wherein the pattern comprises:
   rows of the voltage supply vias having a first polarity, which are interleaved with rows of the voltage supply vias having a second, opposite polarity; and
   columns of the voltage supply vias having the first polarity, which are interleaved with columns of the voltage supply vias having a second, opposite polarity.

3. The substrate of claim 1, wherein the plurality of voltage supply vias comprise plated through-holes.

4. The substrate of claim 1, wherein the plurality of voltage supply vias comprise buried vias.

5. The substrate of claim 1, wherein the plurality of voltage supply vias comprise blind vias.

6. The substrate of claim 1 wherein the pattern is located on an area of the substrate, which comprises only the voltage supply vias and is void of any signal vias.

7. The substrate of claim 6 wherein the pattern of voltage supply vias is contained within a core voltage supply area, which is surrounded by a signal area comprising signal vias.

8. The substrate of claim 1 wherein:
   the voltage supply vias comprise buried vias;
   the pattern further comprises a respective blind via for each buried via, which is electrically coupled to the respective buried via; and
   each buried via in the pattern is separated from a nearest other buried via in the pattern in the four orthogonal directions by at least one of the blind vias.

9. The substrate of claim 1 wherein the layer of woven fiber reinforcement comprises a layer of woven glass fiber running in the orthogonal pattern, through which the voltage supply vias extend.

10. A substrate comprising:
    a layer of fiber reinforcement having fibers extending in an orthogonal pattern; and
    a pattern of voltage supply vias extending through the layer of fiber reinforcement and comprising rows of the voltage supply vias having a first polarity, which are interleaved with rows of the voltage supply vias having a second, opposite polarity, and columns of the voltage supply vias having the first polarity, which are interleaved with columns of the voltage supply vias having a second, opposite polarity, and wherein the rows and columns are generally parallel to respective fibers of the layer of fiber reinforcement.

11. The substrate of claim 10 wherein:
    each of the voltage supply vias is surrounded by four of the voltage supply vias of a same polarity in four orthogonal directions and by four voltage supply vias of an opposite polarity in four diagonal directions.

12. The substrate of claim 10, wherein the plurality of voltage supply vias comprise plated through-holes.

13. The substrate of claim 10, wherein the plurality of voltage supply vias comprise buried vias.

14. The substrate of claim 10, wherein the plurality of voltage supply vias comprise blind vias.

15. The substrate of claim 10 wherein the pattern is located on an area of the substrate, which comprises only the voltage supply vias and is void of any signal vias.

16. The substrate of claim 15 wherein the pattern of voltage supply vias is contained within a core voltage supply area, which is surrounded by a signal area comprising signal vias.

17. The substrate of claim 10 wherein:
    the voltage supply vias comprise buried vias;
    the pattern further comprises a respective blind via for each buried via, which is electrically coupled to the respective buried via; and
    each buried via in the pattern is separated from a nearest other buried via in the pattern in four orthogonal directions by at least one of the blind vias.

18. The substrate of claim 10 wherein the layer of fiber reinforcement comprises a layer of woven glass fiber running in the orthogonal pattern, through which the voltage supply vias extend.

19. A substrate comprising:
    a layer of fiber reinforcement having fibers extending in an orthogonal pattern; and
    a first arrangement of electrical contacts on a first surface of the substrate, the first arrangement including a set of first type and second type voltage supply contacts;

a second arrangement of electrical contacts on a second, opposite surface of the substrate, the second arrangement including a set of first type and second type voltage supply contacts;

a plurality of voltage supply vias extending through at least one layer of the substrate, including the layer of fiber reinforcement, wherein each via is electrically coupled between at least one of the voltage supply contacts on the first surface and at least a corresponding one of the voltage supply contacts on the second surface; and a pattern formed by the voltage supply contacts in which each of the voltage supply vias is surrounded by four of the voltage supply vias of the same type in four orthogonal directions, which are generally aligned with the orthogonal pattern of the fiber reinforcement, and by four voltage supply vias of the opposite type in four diagonal directions, such that individual fibers of the fiber reinforcement connect side walls of adjacent ones of the voltage supply vias having the same polarity only.

* * * * *